(12) United States Patent
Koval et al.

(10) Patent No.: US 10,128,262 B2
(45) Date of Patent: Nov. 13, 2018

(54) VERTICAL MEMORY HAVING VARYING STORAGE CELL DESIGN THROUGH THE STORAGE CELL STACK

(71) Applicant: INTEL CORPORATION, Santa Clara, CA (US)

(72) Inventors: Randy J. Koval, Boise, ID (US); Hiroyuki Sanda, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 38 days.

(21) Appl. No.: 14/998,251

(22) Filed: Dec. 26, 2015

(65) Prior Publication Data

US 2017/0186765 A1 Jun. 29, 2017

(51) Int. Cl.

| | |
|---|---|
| H01L 27/115 | (2017.01) |
| G11C 16/26 | (2006.01) |
| H01L 27/11582 | (2017.01) |
| H01L 27/11556 | (2017.01) |
| H01L 27/11524 | (2017.01) |
| H01L 27/1157 | (2017.01) |
| G11C 16/08 | (2006.01) |
| H01L 27/11526 | (2017.01) |
| H01L 27/11573 | (2017.01) |
| H01L 21/3213 | (2006.01) |
| H01L 27/11519 | (2017.01) |
| H01L 27/11565 | (2017.01) |

(52) U.S. Cl.
CPC ........ *H01L 27/11582* (2013.01); *G11C 16/08* (2013.01); *G11C 16/26* (2013.01); *H01L 21/32133* (2013.01); *H01L 27/1157* (2013.01); *H01L 27/11519* (2013.01); *H01L 27/11524* (2013.01); *H01L 27/11526* (2013.01); *H01L 27/11556* (2013.01); *H01L 27/11565* (2013.01); *H01L 27/11573* (2013.01)

(58) Field of Classification Search
CPC ......... H01L 27/11582; H01L 27/11556; H01L 27/11524; H01L 27/1157; H01L 27/11526; H01L 27/11519; H01L 27/11565; H01L 27/0207
USPC ........................................ 257/314, 315, 316
See application file for complete search history.

(56) References Cited

U.S. PATENT DOCUMENTS

| | | |
|---|---|---|
| 8,378,412 B2 | 2/2013 | Goda |
| 9,076,824 B2 | 7/2015 | Sakui et al. |
| 9,082,714 B2 | 7/2015 | Koval et al. |
| 2010/0019310 A1 | 1/2010 | Sakamoto |
| 2012/0091521 A1 | 4/2012 | Goda |

(Continued)

FOREIGN PATENT DOCUMENTS

KR 10-2015-0133658 11/2015

OTHER PUBLICATIONS

Notification of Transmittal of the International Search Report and the Written Opinion of the International Searching Authority issued for International Patent Application No. PCT/US2016/060151, dated Feb. 27, 2017.

*Primary Examiner* — Johannes P Mondt
(74) *Attorney, Agent, or Firm* — Compass IP Law PC

(57) ABSTRACT

An apparatus is described having a memory. The memory includes a vertical stack of storage cells, where, a first storage node at a lower layer of the vertical stack has a different structural design than a second storage node at a higher layer of the vertical stack.

19 Claims, 20 Drawing Sheets

(56) References Cited

U.S. PATENT DOCUMENTS

| | | | |
|---|---|---|---|
| 2013/0117580 A1* | 5/2013 | Chin | G06F 1/266 |
| | | | 713/300 |
| 2014/0126290 A1* | 5/2014 | Sakui | H01L 29/7889 |
| | | | 365/185.05 |
| 2014/0129753 A1* | 5/2014 | Schuette | G06F 13/4068 |
| | | | 710/301 |
| 2014/0252454 A1 | 9/2014 | Rabkin et al. | |
| 2015/0178203 A1* | 6/2015 | Torrant | G06F 12/0811 |
| | | | 711/122 |
| 2015/0206901 A1 | 7/2015 | Lee et al. | |
| 2015/0371709 A1* | 12/2015 | Kai | G11C 16/0425 |
| | | | 365/185.17 |

* cited by examiner

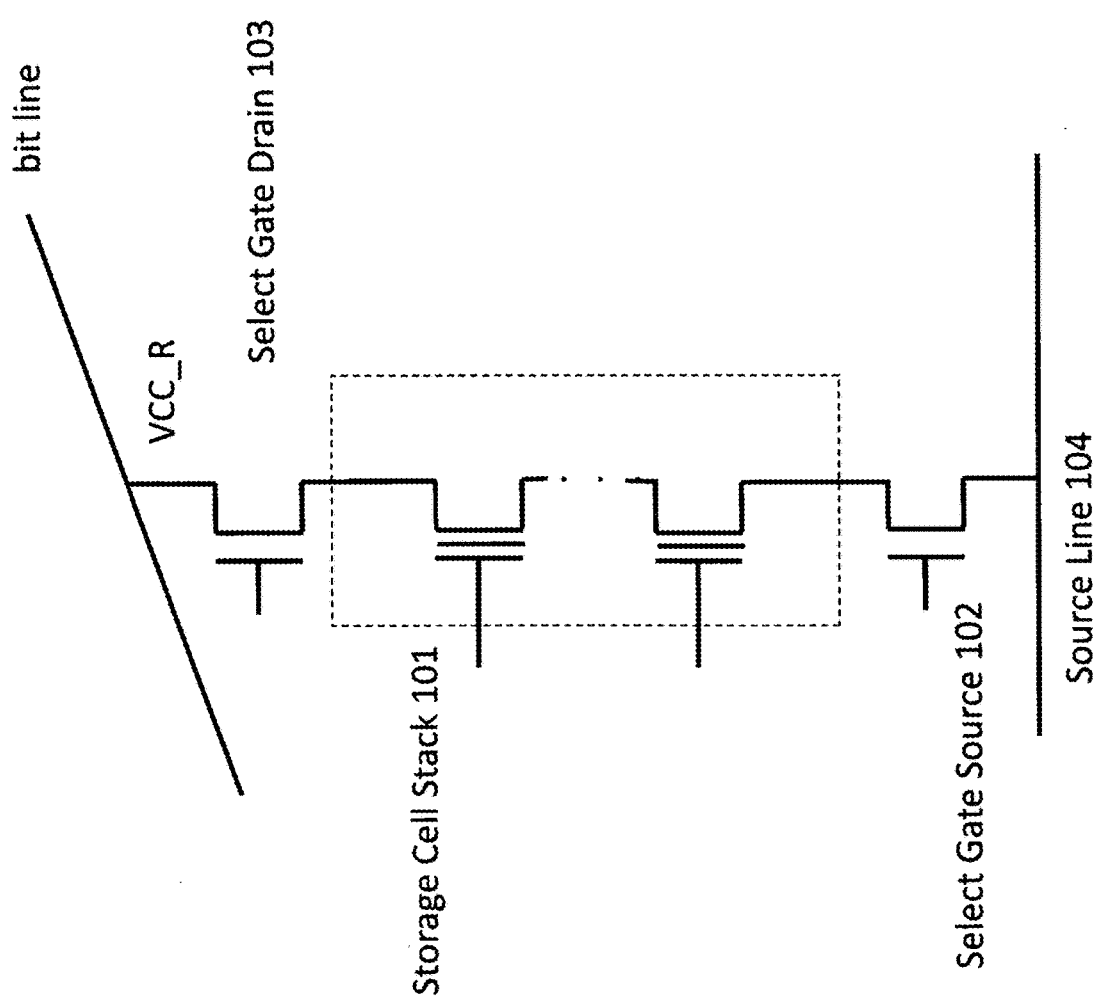

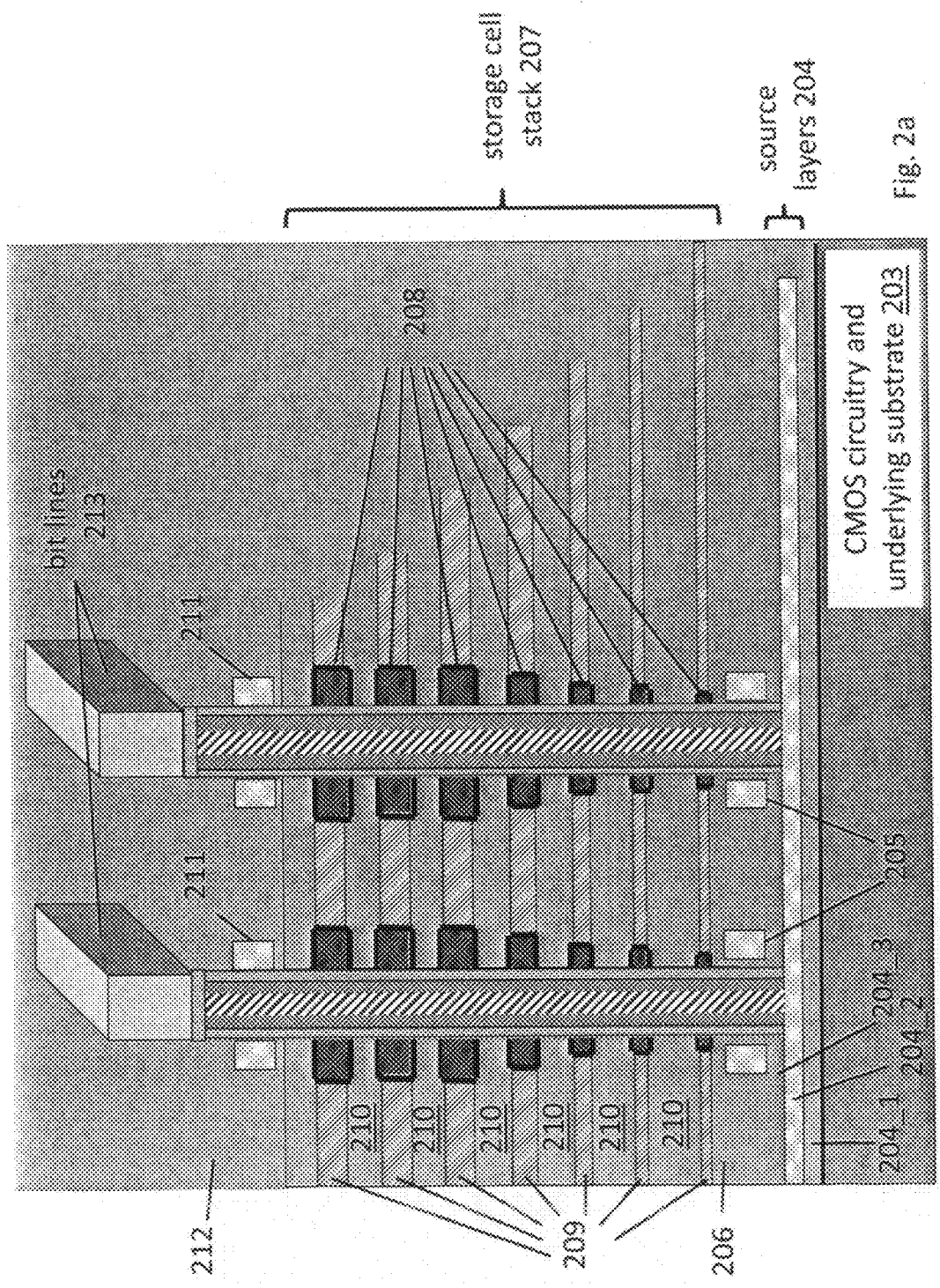

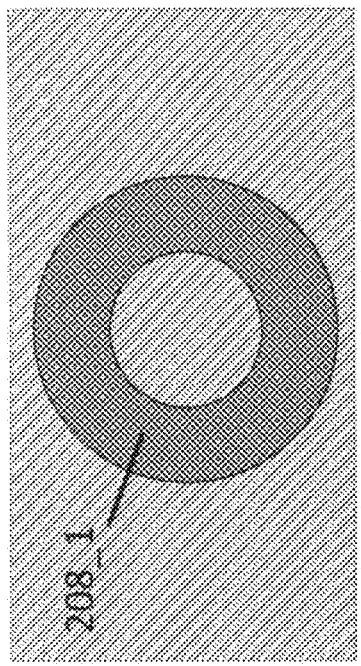
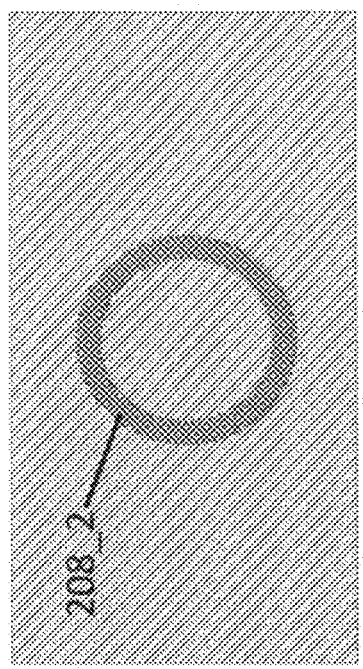
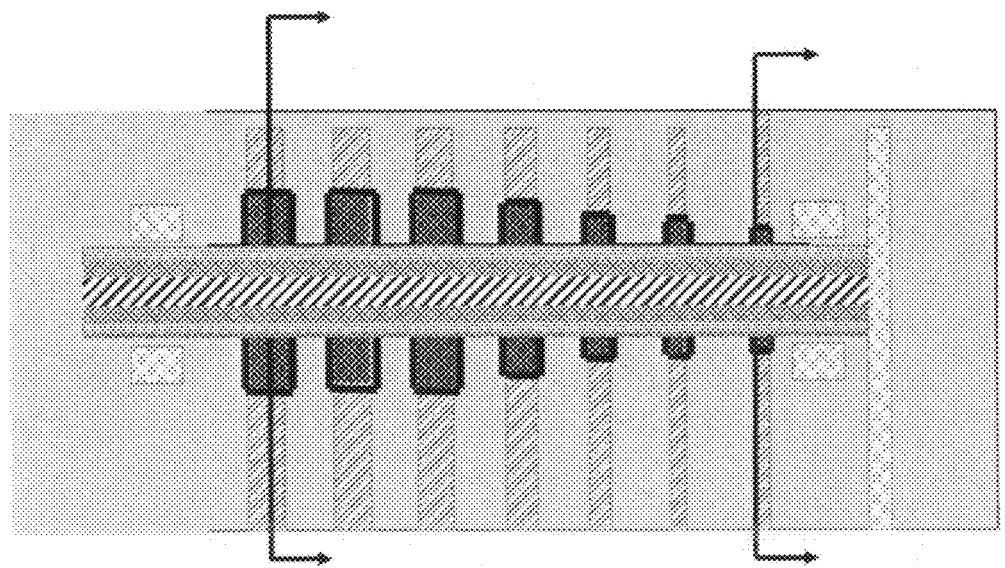
Fig. 2b

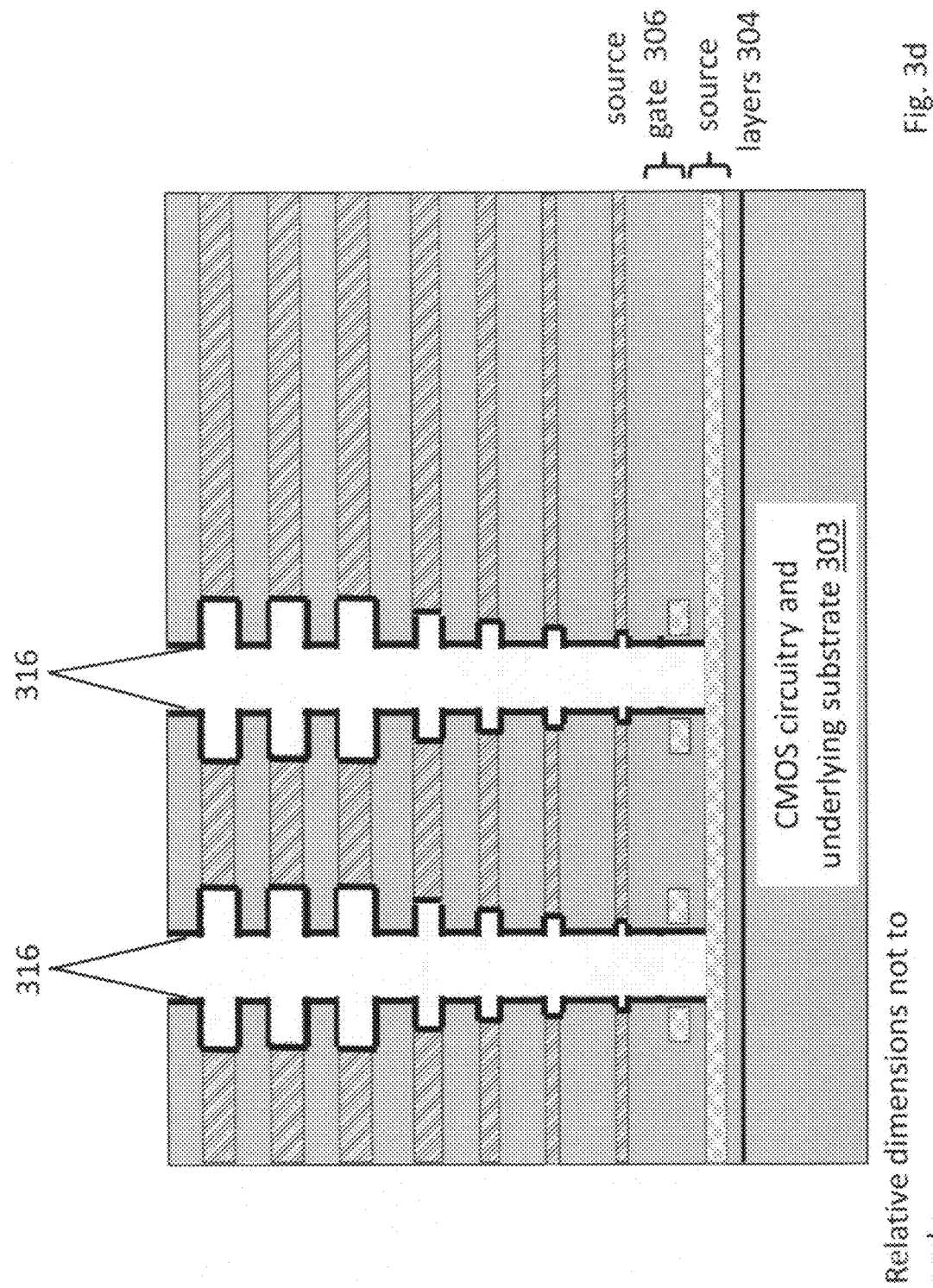

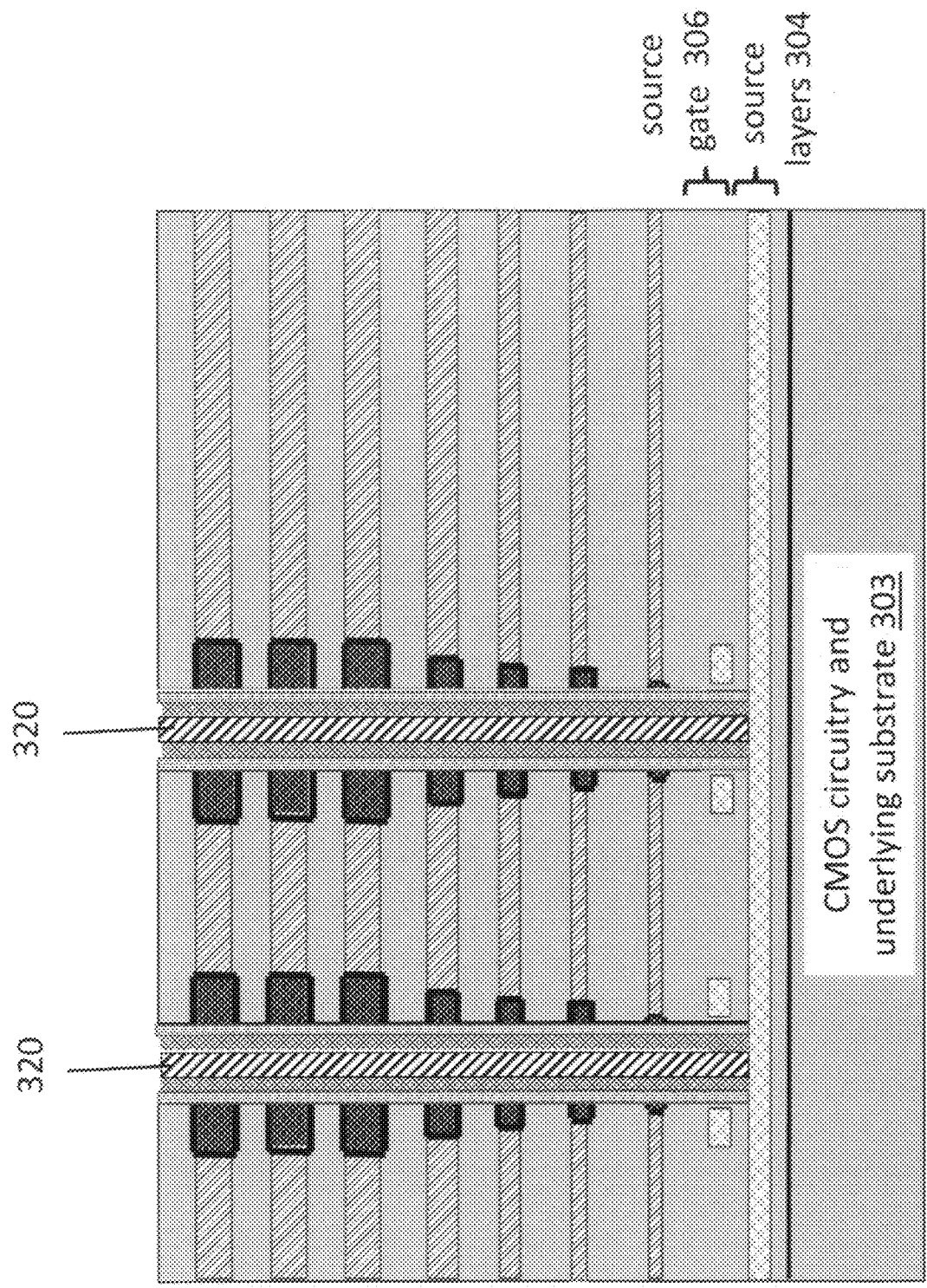

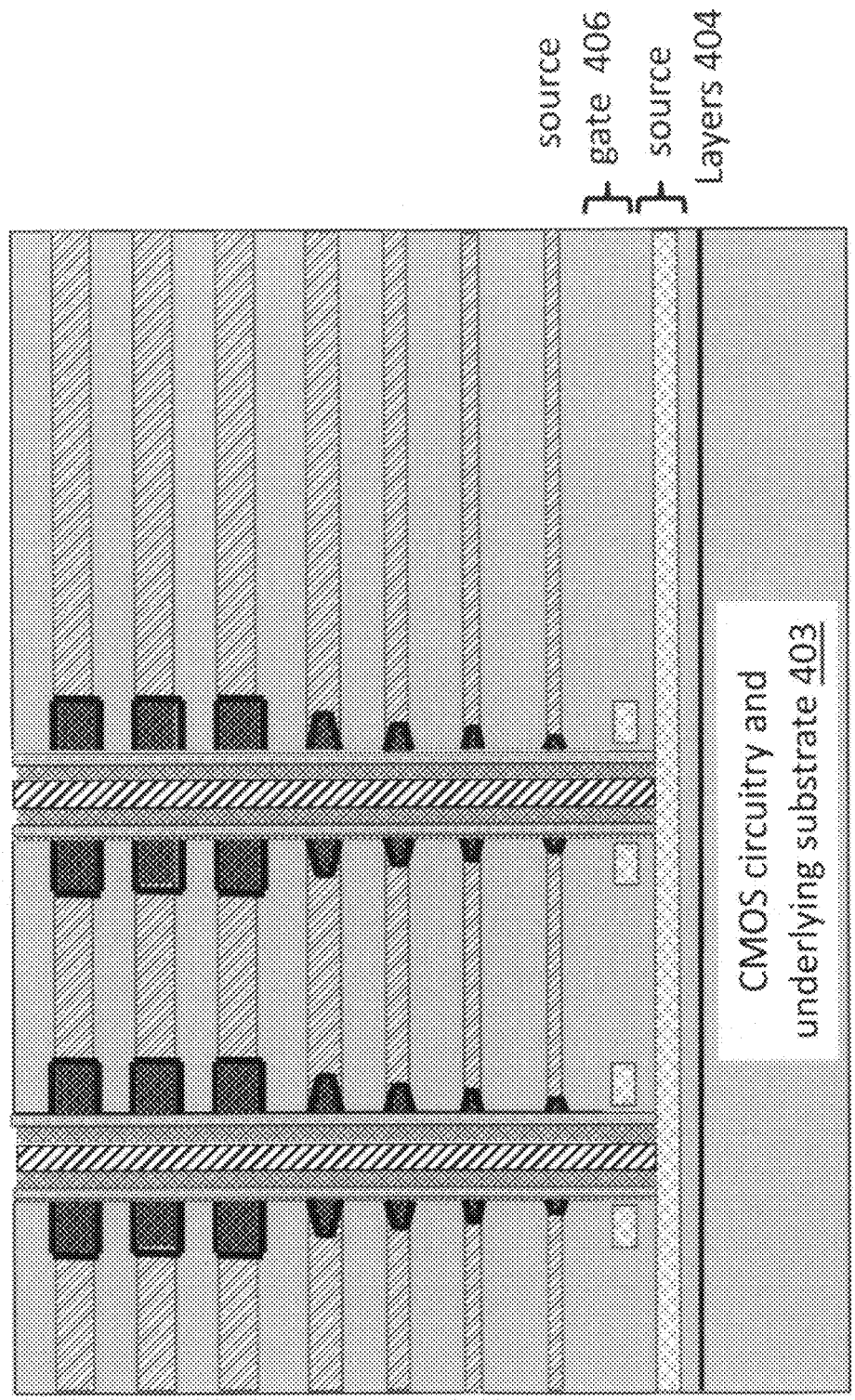

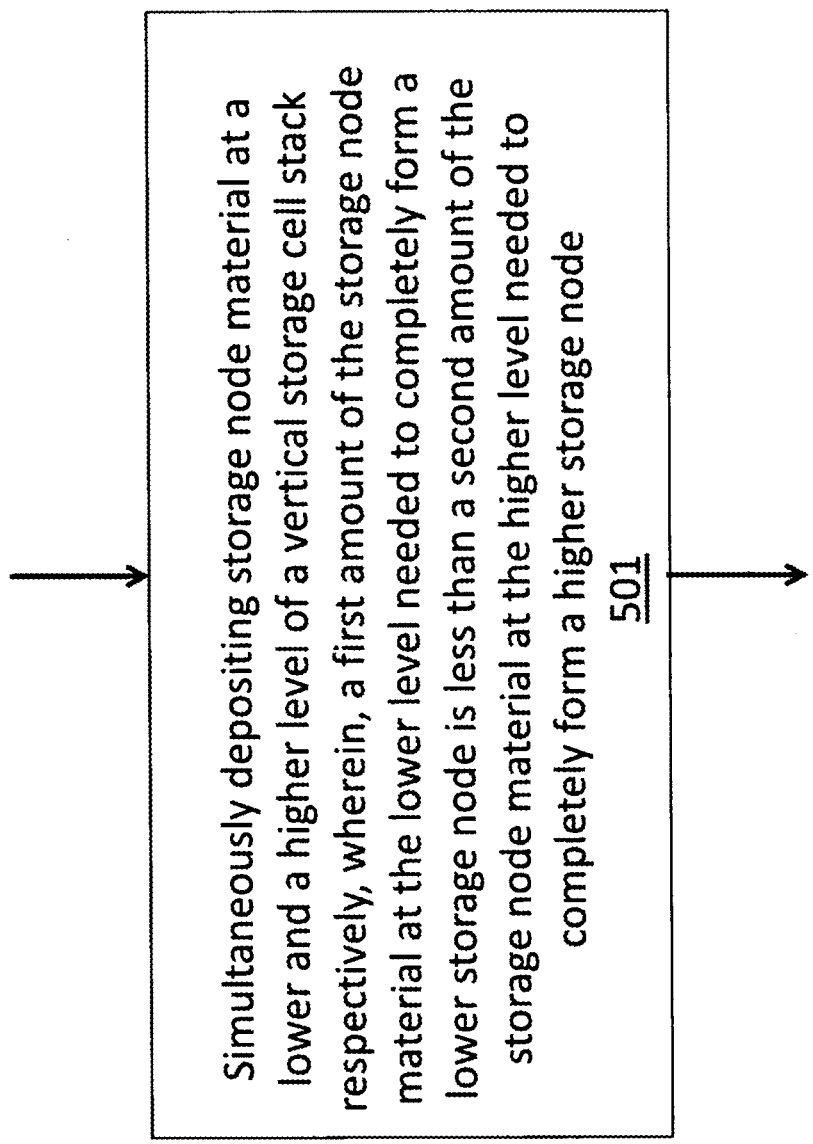

Fig. 5

Simultaneously depositing storage node material at a lower and a higher level of a vertical storage cell stack respectively, wherein, a first amount of the storage node material at the lower level needed to completely form a lower storage node is less than a second amount of the storage node material at the higher level needed to completely form a higher storage node
501

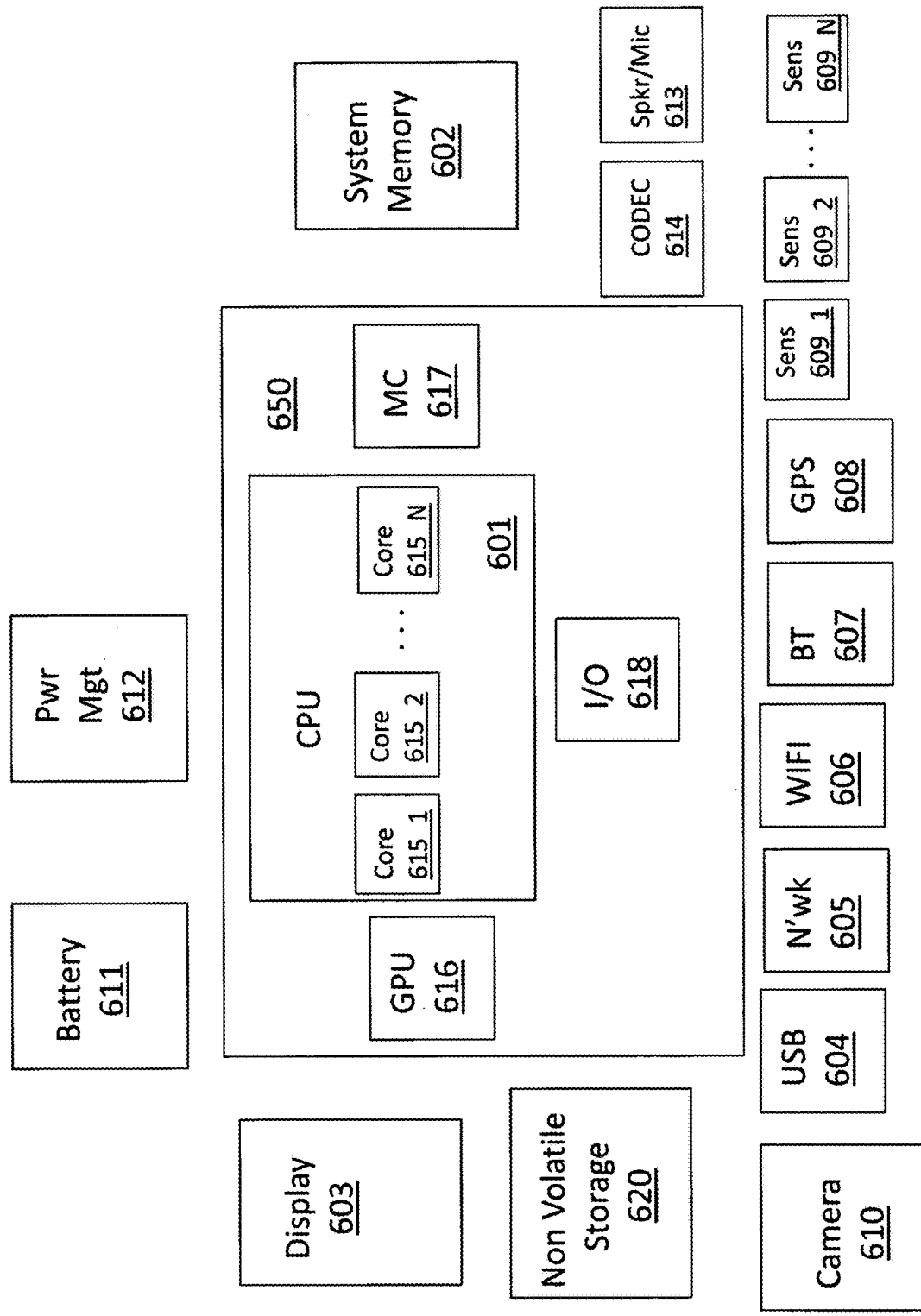

VERTICAL MEMORY HAVING VARYING STORAGE CELL DESIGN THROUGH THE STORAGE CELL STACK

FIELD OF INVENTION

The field of invention pertains generally to the semiconductor manufacturing arts, and, more generally, to a vertical memory having varying storage cell design through the storage cell stack.

BACKGROUND

The emergence of mobile devices has created keen interest amongst non volatile semiconductor memory manufacturers to increase the densities of their devices. Generally, mobile devices do not make use of disk drives in favor of semiconductor based non volatile storage devices. Historically, however, semiconductor storage devices do not have the same storage density as disk drives.

In order to bring the storage densities of semiconductor memories closer to or beyond disk drives, non volatile memory device manufacturers are developing three dimensional memory technologies. In the case of three dimensional memory technologies, individual storage cells are vertically stacked on top of another within the storage device. Three dimensional memory devices may therefore provide a mobile device with disk drive like storage density in a much smaller package, cost and power consumption envelope. However, the manufacture of three dimensional memory devices raises new manufacturing technology challenges.

FIGURES

A better understanding of the present invention can be obtained from the following detailed description in conjunction with the following drawings, in which:

FIG. 1 shows a transistor level design of a storage cell stack;

FIG. 2a shows a cross section design for a manufactured storage cell stack;

FIG. 2b shows a top down view of a storage node;

FIGS. 3a through 3i show a method for manufacturing the storage cell stack of FIG. 2;

FIGS. 4a through 4f show alternate embodiments of the manufactured storage cell stack of FIG. 2;

FIG. 5 shows a method illustrated by the manufacturing method of FIGS. 3a through 3i;

FIG. 6 shows a computing system.

DETAILED DESCRIPTION

Figure 3A:
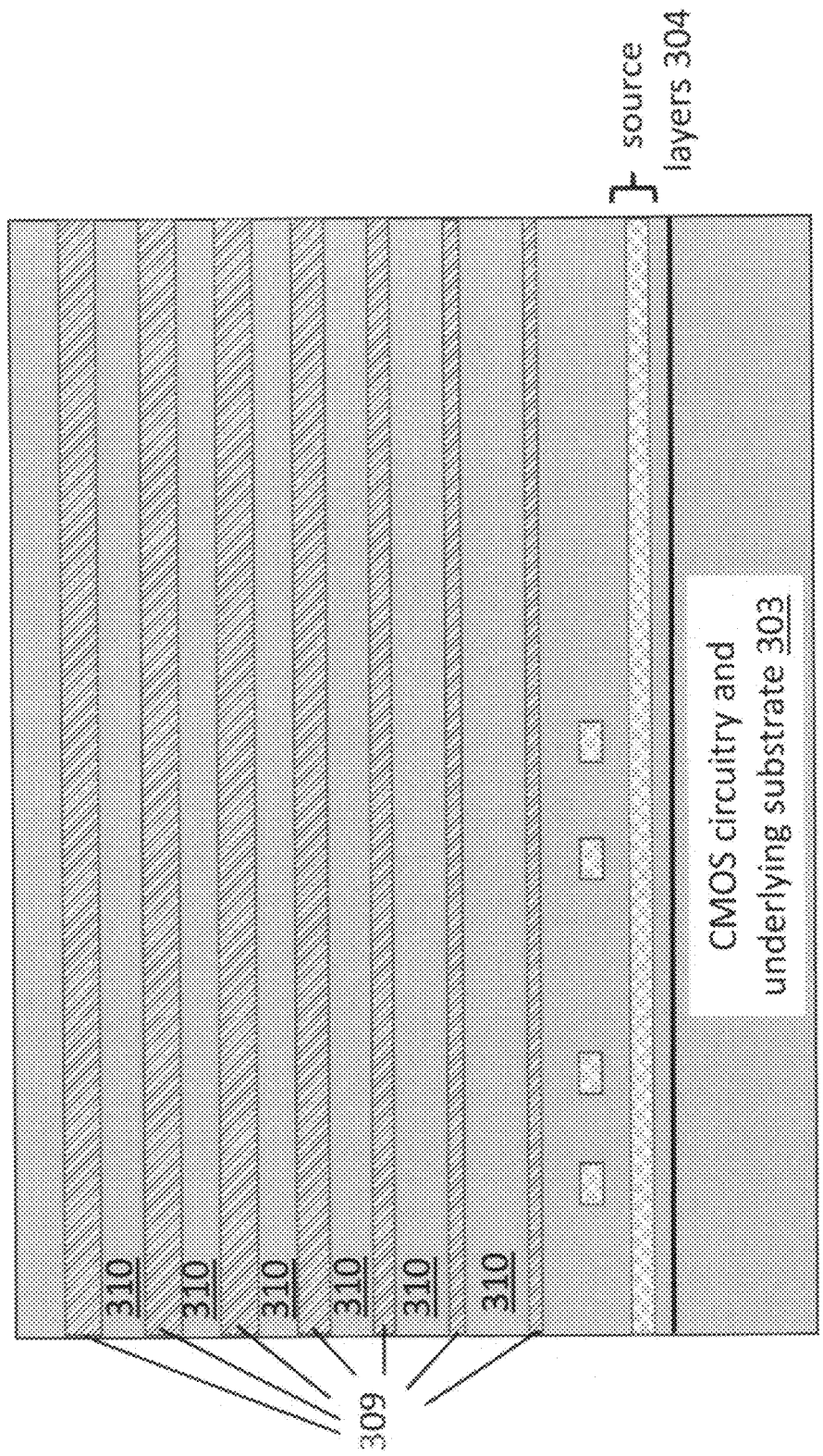

FIG. 1 shows a circuit schematic for the storage cell region of a three dimensional NAND FLASH memory. As observed in FIG. 1, the circuit includes a stack of NAND FLASH storage cells 101 coupled between a select gate source transistor 102 and a select gate drain transistor 103. The select gate source transistor 102 is coupled to a source line 104. The stack of storage cells 101 may be implemented as a three dimensional stack of FLASH transistors that are monolithically integrated as a three dimensional storage array on a semiconductor chip along with the select gate source and select gate drain transistors 102, 103 as well as other transistor devices (not shown) that help implement, e.g., the NAND function of the storage cell, sense amplifiers, row decoders, address decoders, etc.

In various embodiments, the storage cell stack 101 may be physically sandwiched between the select gate source transistor 102 (which, e.g., may reside beneath the storage cell stack) and the select gate drain transistor 103 (which, e.g., may reside above the storage cell). As the storage cell stack grows in height to accommodate more layers of storage cells so as to increase the density of the memory device, it becomes more difficult to form uniform circuit structures of the storage cell stack. That is, the sheer height of the storage cell stack 101 makes it difficult to apply uniform processing characteristics along the entire height of the stack. For instance, the storage gate nodes at the bottom of the stack may be improperly formed because it is difficult to generate the same processing conditions at the bottom of the structure that exist toward the top of the structure.

FIG. 2a shows an improved three dimensional NAND structure that deliberately modulates the shape and/or form of the storage cell gate nodes 208 as a function of their position along the depth of the storage cell stack 207. More specifically, the shape and/or form of the gate nodes 208 at the bottom of the stack 207 are by design easier to form because the processing conditions at the bottom of the stack 207 are typically not as affective as they may be toward the top of the stack 207. As such, as observed in FIG. 2a, both the depth and/or width of the storage cell gate nodes 208 are designed to be less wide and thinner with increasing distance down the length of the stack 207 (e.g., toward source layers 204).

As observed in FIG. 2a, lower level transistors 203 used to implement, e.g., sense amplifiers, address decoders, row decoders, etc., are disposed on a semiconductor substrate beneath the storage cell region of the device. Above the lower level transistors 203, a plurality of source layers 204 are formed. Source layers 204 are used to form the source lines 104 of the memory device. In an embodiment, the source layers include a dielectric layer 204_1 (e.g., an oxide layer), one or more conductive layers 204_2 and another, upper dielectric layer 204_3.

The lower dielectric layer 204_1 helps insulate the lower transistors 203 from the upper storage cell stack 206. The conductive layering 204_2 form the actual source line wiring. In an embodiment, the conductive layering 204_2 can be a multi-layer structure composed of a lower layer of metal (e.g., Tungsten Silicide (WSix)) and an upper layer of poly silicon. The upper dielectric layer 204_3 insulates the source lines 204_2 from the storage cell stack 207.

The select gate source transistor structures 205 are formed over the upper dielectric layer 204_3. In an embodiment, the select gate source transistor structures 205 include a poly silicon layer. A dielectric layer 206 is formed above the select gate source transistor structures 205 to separate the select gate source transistor structures from the storage cell stack 207.

A storage cell stack 207 (e.g., FLASH transistor cells) is formed above dielectric layer 206. The stacked storage devices are constructed, in an embodiment, from alternating poly-silicon 209 and oxide layers 210. In various embodiments, there may be, e.g., more than twenty tiers of storage devices in a single storage device (for simplicity of drawing FIG. 2a only shows seven tiers, although in typical implementations the number of tiers is typically some factor of 2).

The select gate drain transistor device structures are formed above the storage stack 207. In an embodiment, the select gate drain transistor device structures are formed from a first, lower layer of poly-silicon 211 and an upper dielectric layer 212 (e.g., composed of nitride). FIG. 2a also shows the presence of bit lines 213 above the select gate source drain transistor device structures 211. Each of bit lines 213 carry an individual bit of information to/from a respective storage cell. A particular storage cell is also coupled to a via (not shown) that drops down from above the stack 207 to the storage cell's particular poly-silicon layer 209. As such, the poly-silicon layers 209 are observed to extend beneath the bit lines 213 in varying lengths to effectively create space for these vias.

FIG. 2b shows, on the right hand side, a top down view of the storage nodes 208. Here, note that the storage nodes 208 are annular in shape. With the deeper storage nodes being composed of less material than storage nodes that are higher up in the stack, note that lower storage node 208_2 has a thinner width and radius than those of upper storage node 208_1.

FIGS. 3a through 3i show a method of manufacturing the three dimensional storage device of FIG. 2. The drawings are not necessarily to scale in order to make the principles of the teaching easier to visualize. FIG. 3a shows the structure after the alternating poly-silicon and dielectric layers 309, 310. In an embodiment, each poly-silicon layer 309 is deposited, e.g., by chemical vapor deposition. The dielectric layers 310 may be formed as deposited layers of silicon dioxide (e.g., by chemical vapor deposition (CVD) of oxide). Importantly, note that layers of poly-silicon are thicker moving up the vertical height of the stack. That is, e.g., the lowest layer of poly-silicon (e.g., nearest CMOS circuitry 303) is a thinnest layer of poly-silicon. Then each next layer of poly-silicon is thicker than its immediately lower poly-silicon layer. As will be made more evident in the immediately following discussion, processing thicker layers of poly-silicon becomes more troublesome toward the bottom of the storage cell stack. As such having thinner poly-silicon layers towards the bottom of the stack provides for more complete processing in the lower stack regions.

Figure 3B:
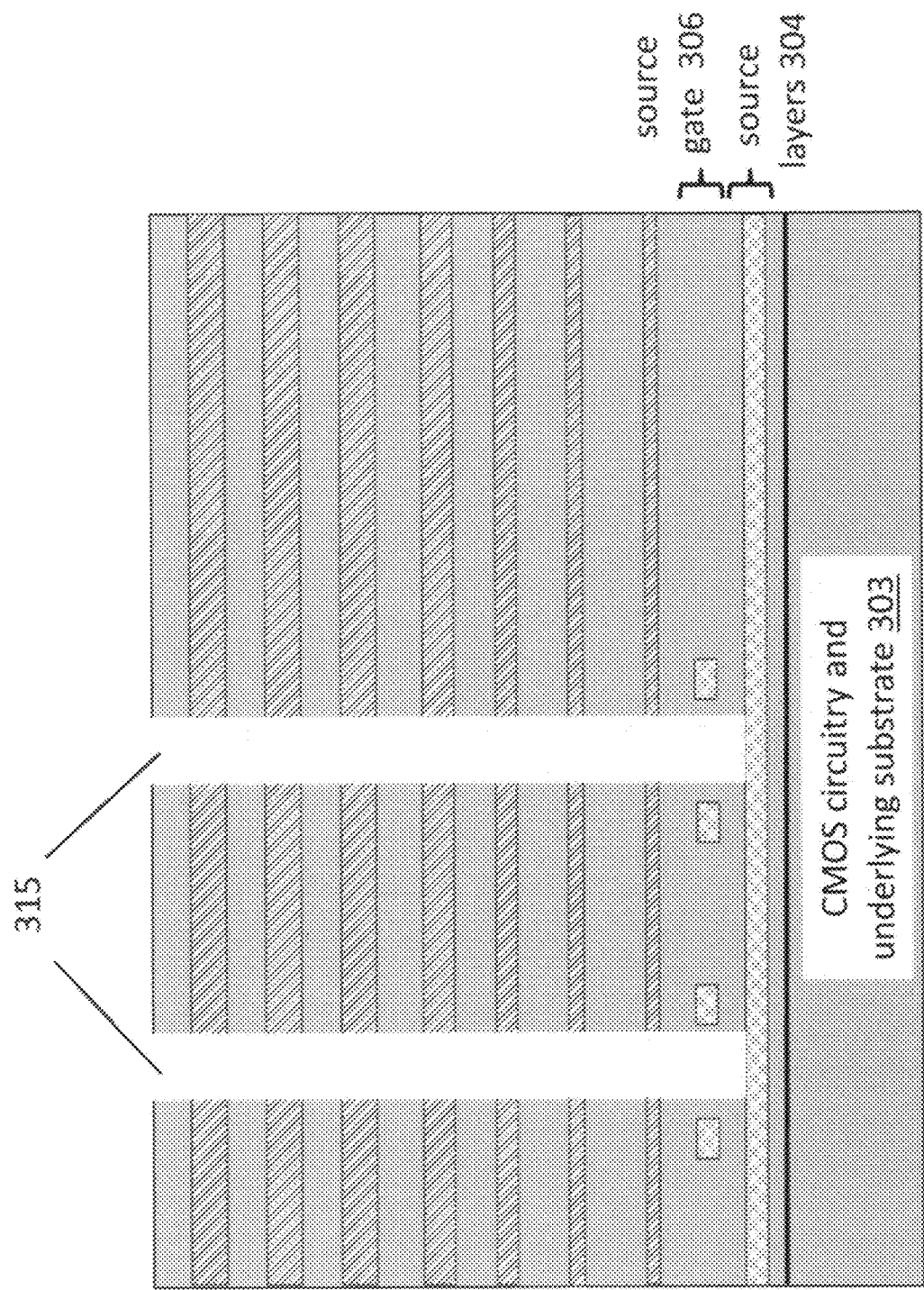

As observed in FIG. 3b, holes 315 are etched into the stack structure. In an embodiment, the etch is performed with an anisotropic plasma etch having a vertical etch rate that is greater than its lateral etch rate. As a consequence, the etch process will etch "down" into the stack at a greater rate than it will etch horizontally across the stack and, consequently, effectively form holes in the storage cell stack. In an embodiment, the plasma etch is not selective to the dielectric (e.g., silicon dioxide or silicon nitride) but is selective to a film that exists beneath the dielectric (not shown in the figures for illustrative ease). In a further embodiment, the lateral etch rates are substantially isotropic so that the holes are circular shaped when viewed from the top down.

Figure 3C:
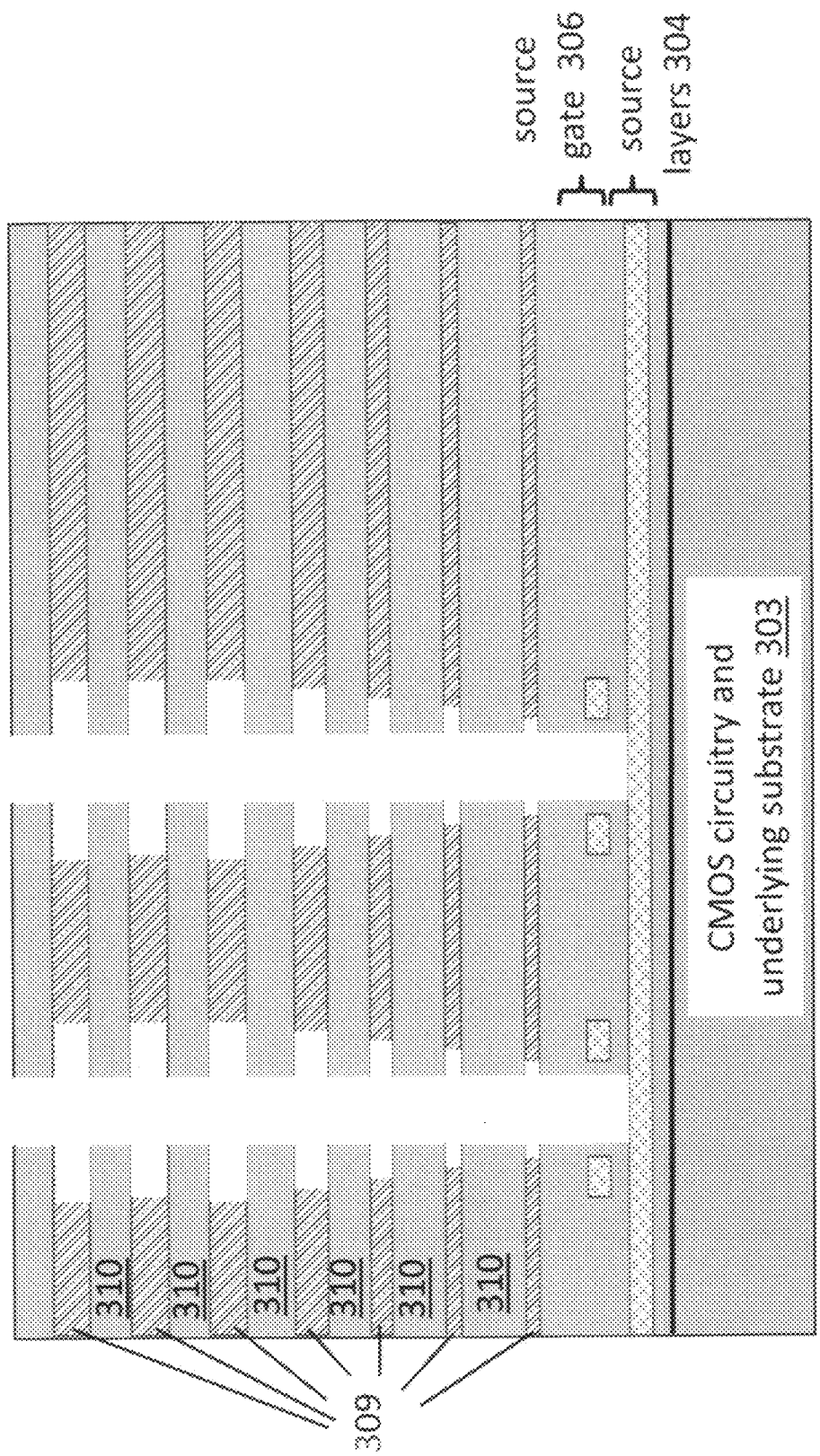

As observed in FIG. 3c, a selective isotropic etch is performed to recess the poly-silicon layers. The etch process removes polysilicon selective to oxide so that substantially only poly-silicon is etched. In an embodiment the etch is a wet (chemical etch). Note that the etching activity may be reduced toward the bottom of the stack but the reduced etch rates is counterbalanced by the thinner poly-silicon layers that reside at the bottom of the stack. As such, a sufficient reduced mass of poly-silicon is successfully etched toward the stack bottom.

A method to achieve the variable etch rate for different tiers in the stack is through modified deposition parameters for individual successive layers of deposited polysilicon, such as varying substitutional doping concentration of the polysilicon film 309 at time of deposition.

As observed in FIG. 3d, the exposed inner walls of the stack holes are lined with a blocking dielectric 316 through a deposition process. In an embodiment, the blocking dielectric may be composed of a hi-k dielectric or oxide-nitride-oxide. Again, the recessed regions at the bottom of the stack will be more easily covered with blocking dielectric material 316 even if the deposition rates are lower at the stack bottom because the recessed regions are more shallow at the stack bottom.

Figure 3E:
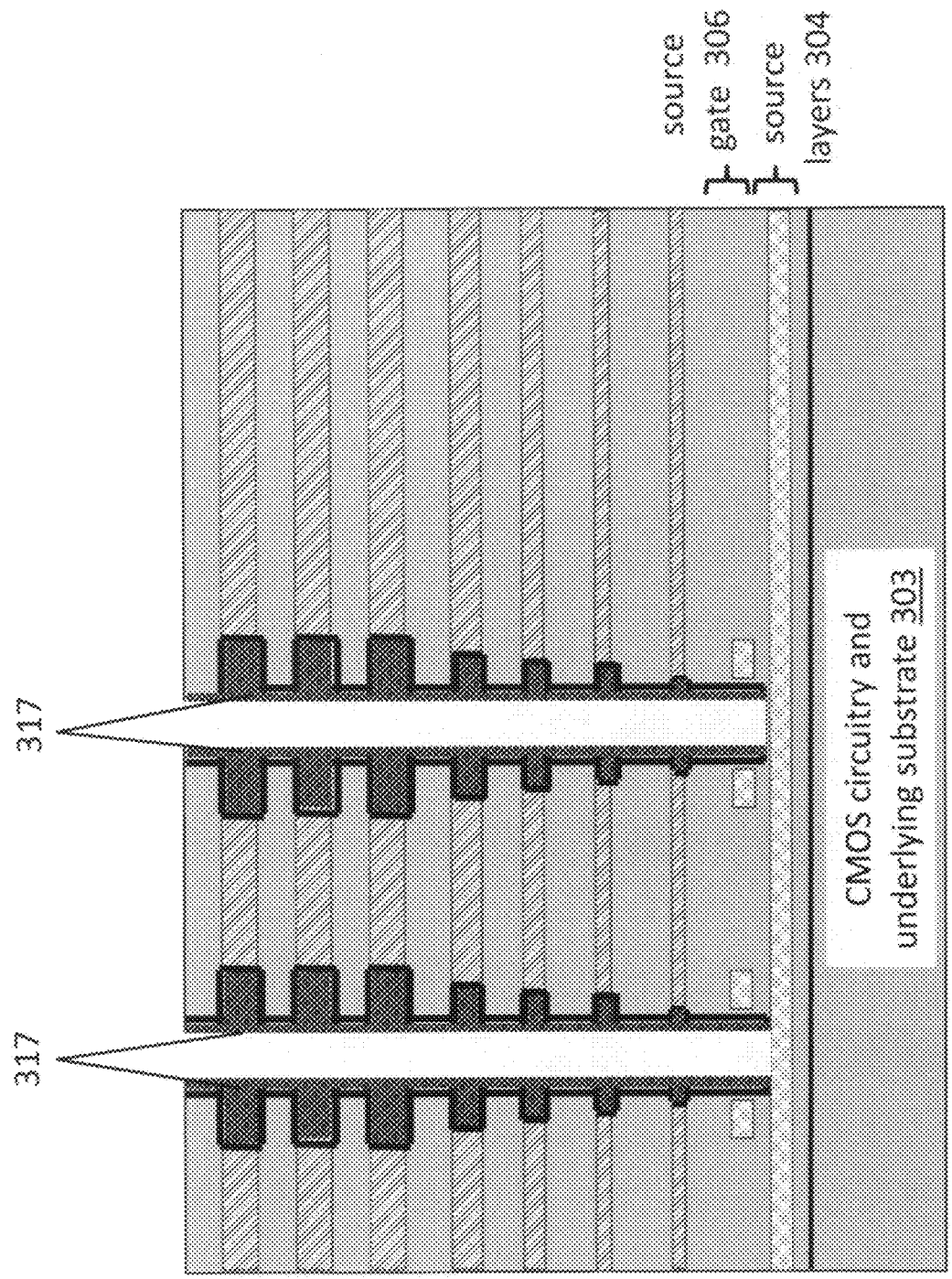
Figure 3F:
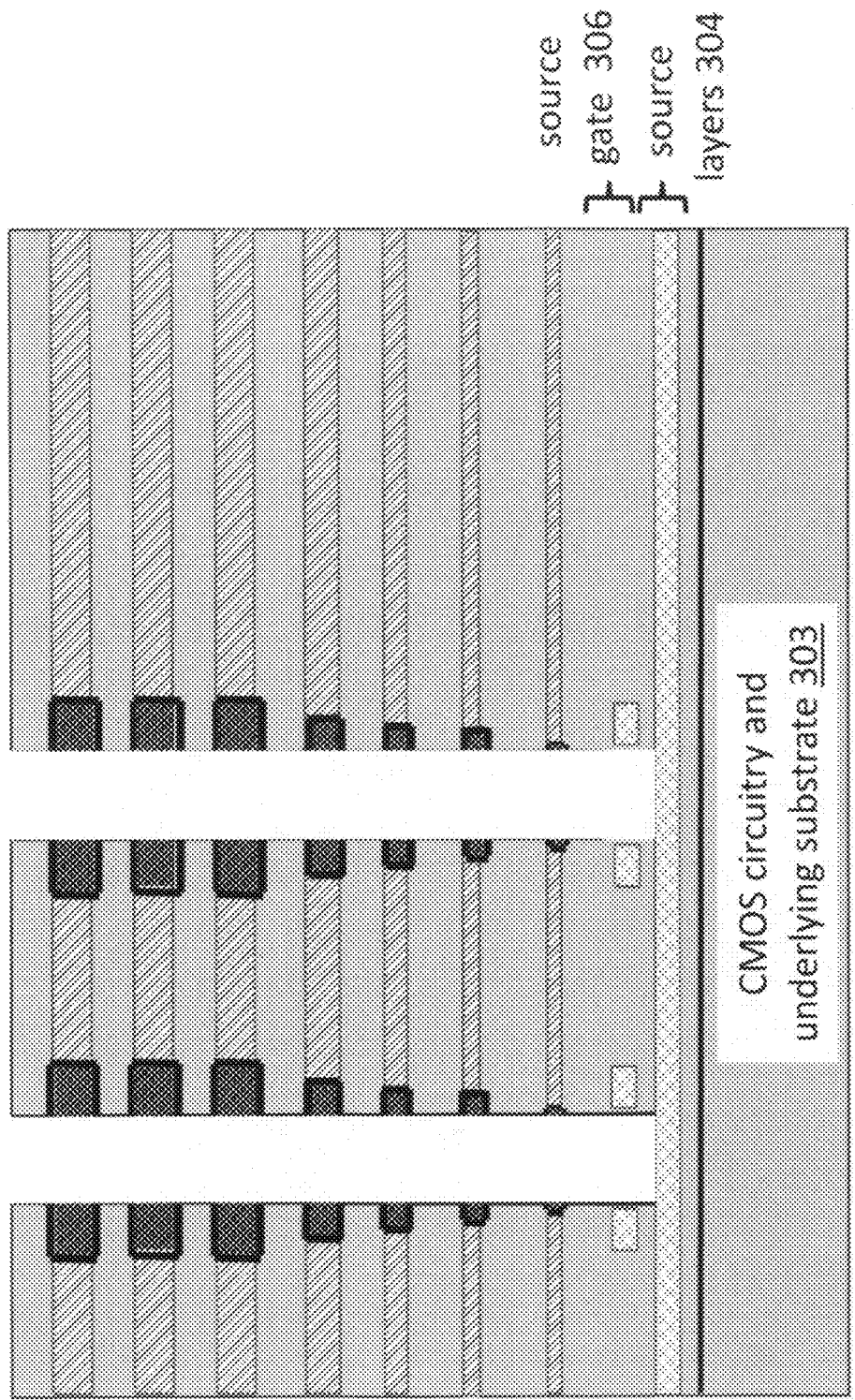

As observed in FIG. 3e, the storage node material 317 (typically poly silicon) is deposited over the blocking dielectric 316 so as to fill the recessed regions that were formed during the etch of FIG. 3c. As with the blocking dielectric 316, the recessed regions at the bottom of the stack will be more easily filled with storage node material 317 even if the deposition rates are lower at the stack bottom because the openings are more shallow at the stack bottom. As observed in FIG. 3f, the storage material is partially etched back to isolate the storage nodes from one another.

Figure 3G:
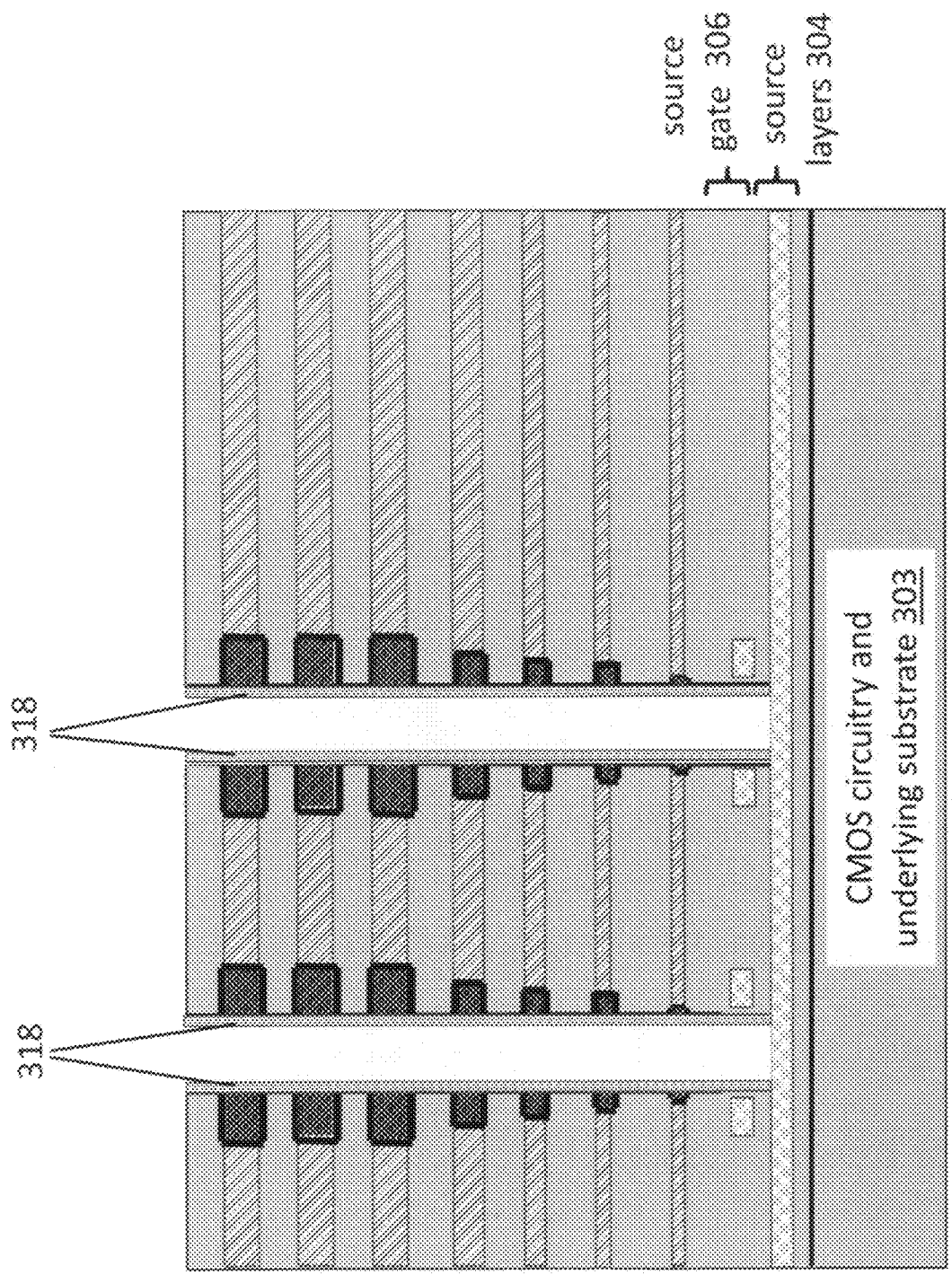
Figure 3H:
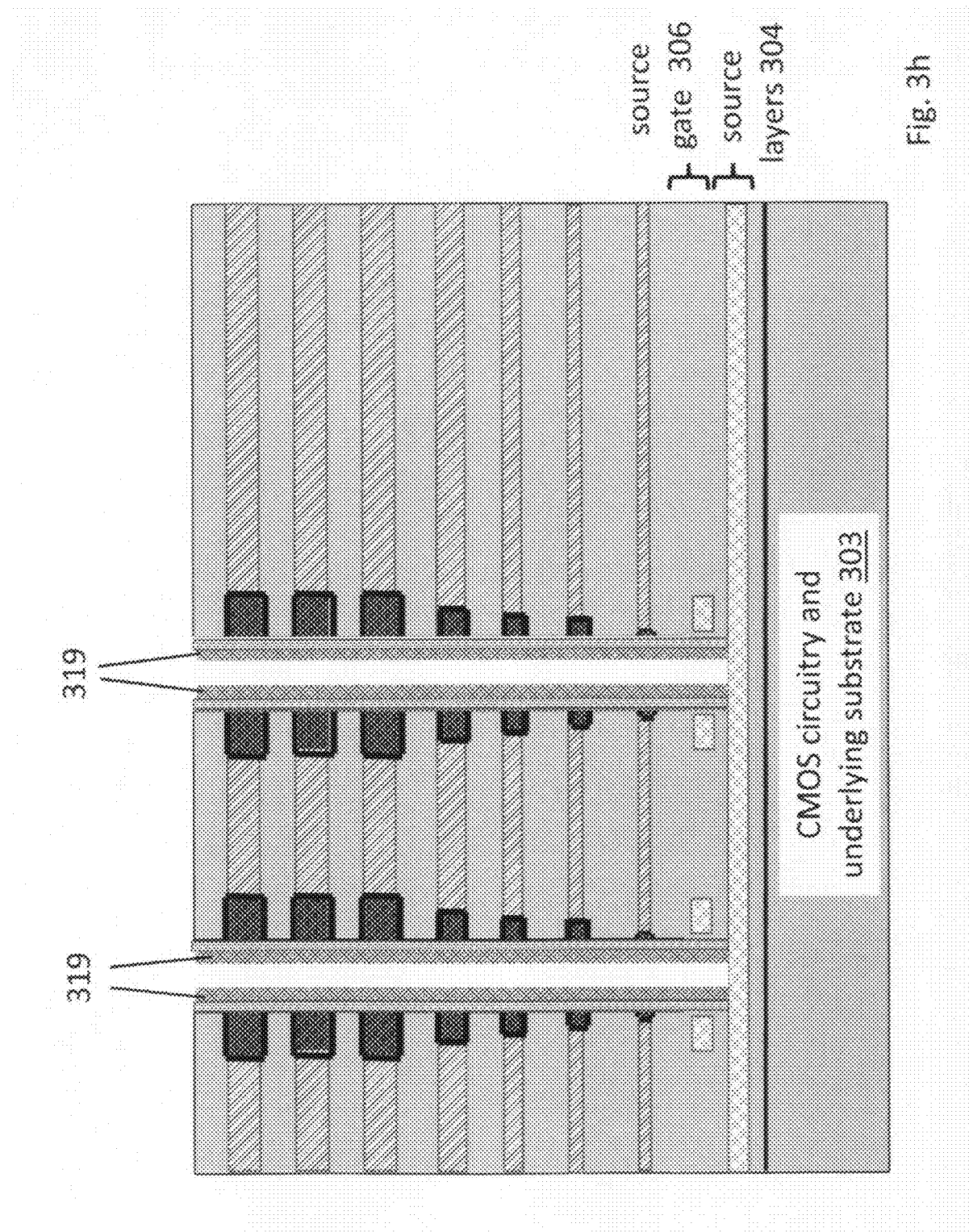

As observed in FIG. 3g, a tunnel dielectric 318 is grown on the surface of the holes. As observed in FIG. 3h a channel conductor 319 is formed over the tunnel dielectric 318. As observed in FIG. 3i, the remaining opening in the holes is filled with dielectric 320. Processing then continues to taper the length of the poly silicon layers 309 within the stack to support the vias that will make contact to the word lines, the formation of the select gate drain transistor device structures and the bit lines to form the more complete structure of FIG. 2.

FIG. 4a shows an extended embodiment in which the storage nodes in the lower part of the storage cell stack have a tapered rather than a block shape. Here, a tapered opening is easier to fill with conductive material. Thus, the tapered storage cell nodes be easier to form in terms of completely filling the void etched into the poly-silicon layering in the storage cell stack. The tapered opening can be triangle shaped. Referring briefly back to FIG. 3c, to form tapered rather than block openings in the poly-silicon layers 309, the poly silicon etch chemistry may be anisotropic in the sense that the lateral etch rate is greater than the vertical etch rate. For simplicity FIG. 4 only shows the lower nodes as being tapered when in various embodiments each of the nodes, including the nodes at the higher stack regions may be tapered.

Figure 4B:
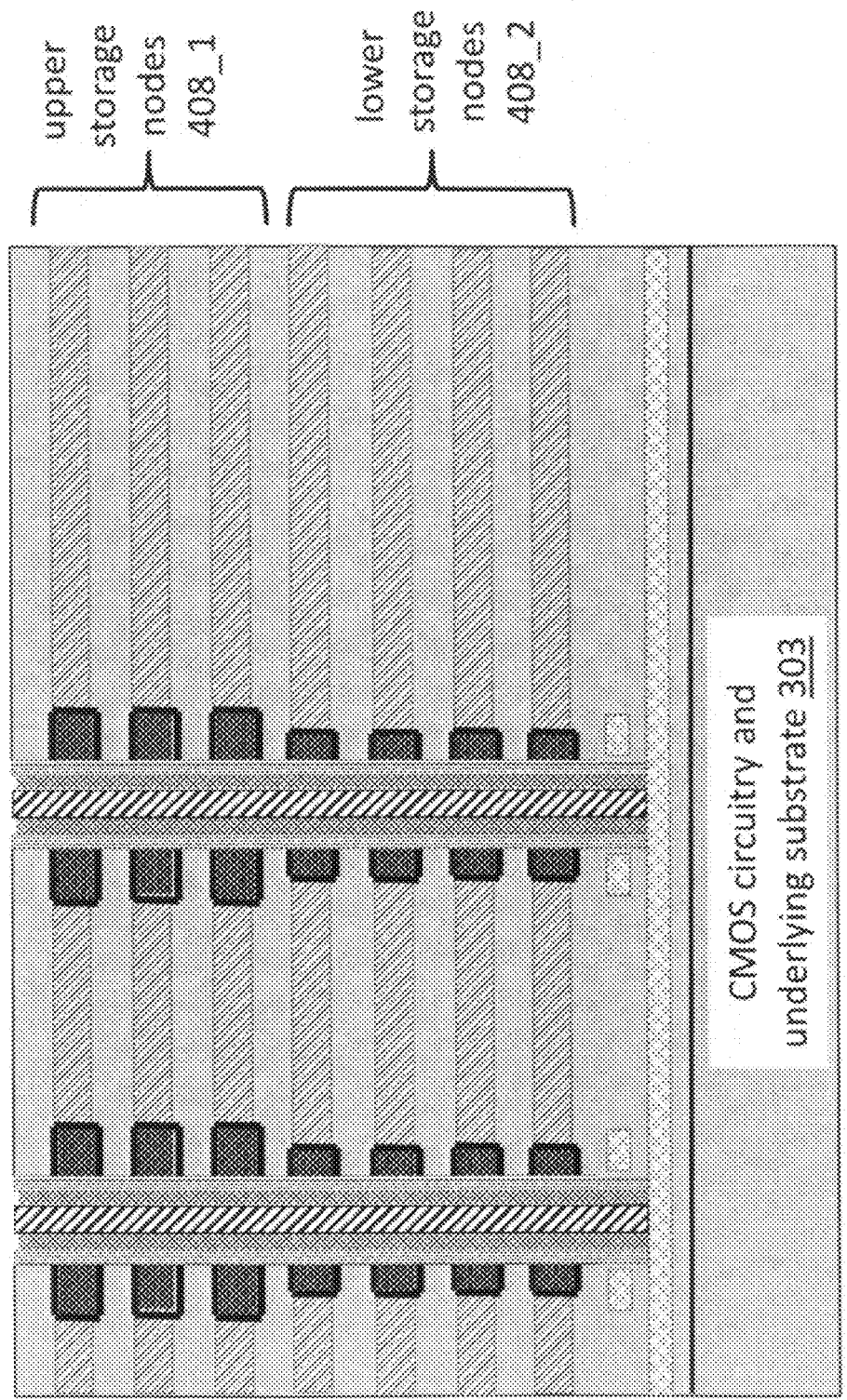
Figure 4C:
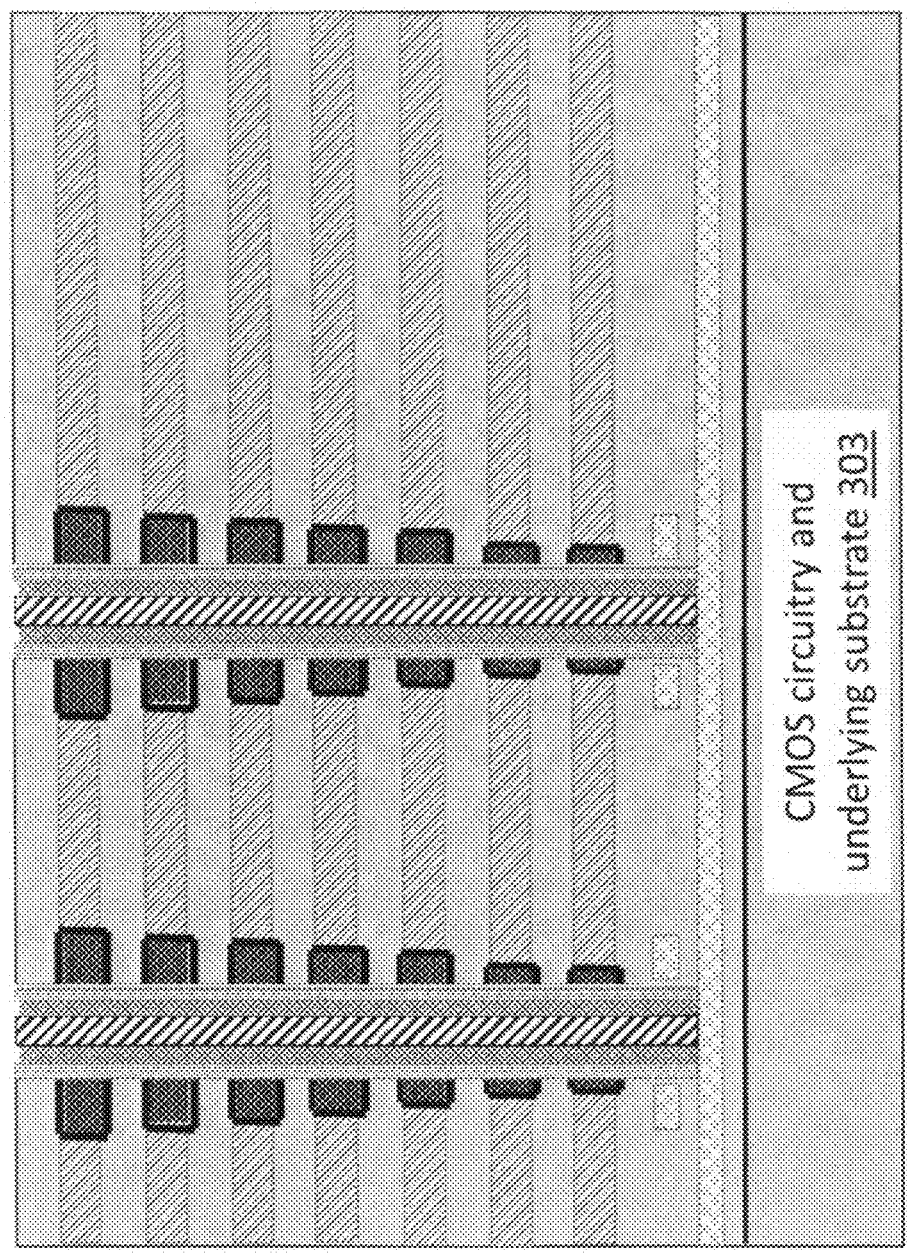

The embodiments of FIGS. 2 and 4a each depict a design in which both poly-silicon layer thickness and storage node depth vary with distance into the stack. In alternate embodiments only one of these parameters may vary. For example, in FIG. 4b, only storage node depth varies (poly-silicon layer thickness does not vary across the different stack layers). Here, as seen in FIG. 4b, upper storage nodes 408_1 have a deeper depth than lower storage nodes 408_2. In another embodiment, the lower storage nodes 408_2 may comprise half or less than half of all of the stack layers. FIG. 4c shows another alternative embodiment in which, again, poly-silicon layer thickness does not vary but storage node depth is continuously shallower with each deeper stack layer. Thus the embodiment of FIG. 4c contemplates each layer having a different storage node depth, while, e.g., the embodiment of FIG. 4b contemplates multiple layers having a same storage node depth.

Figure 4D:
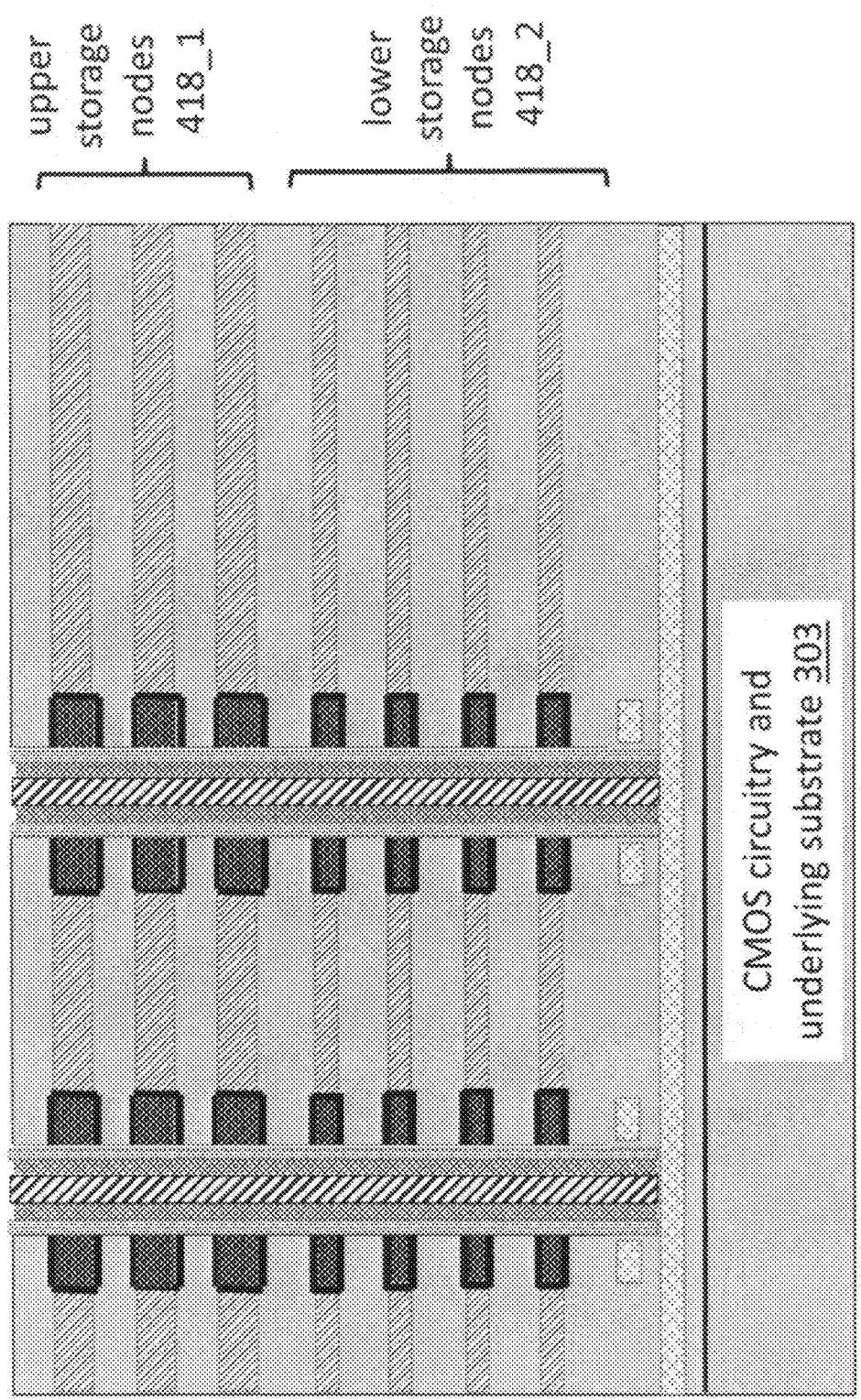
Figure 4E:
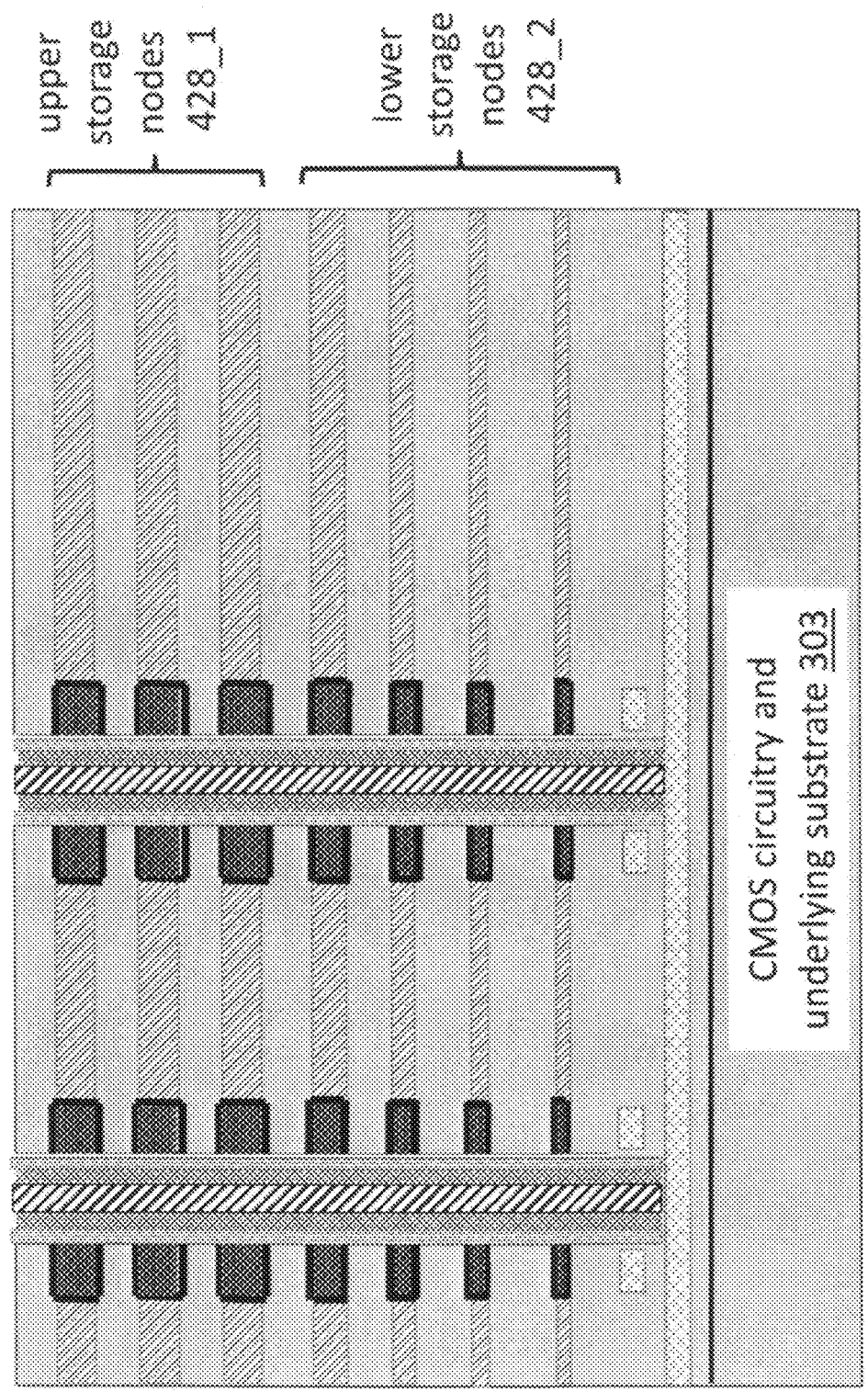
Figure 4F:
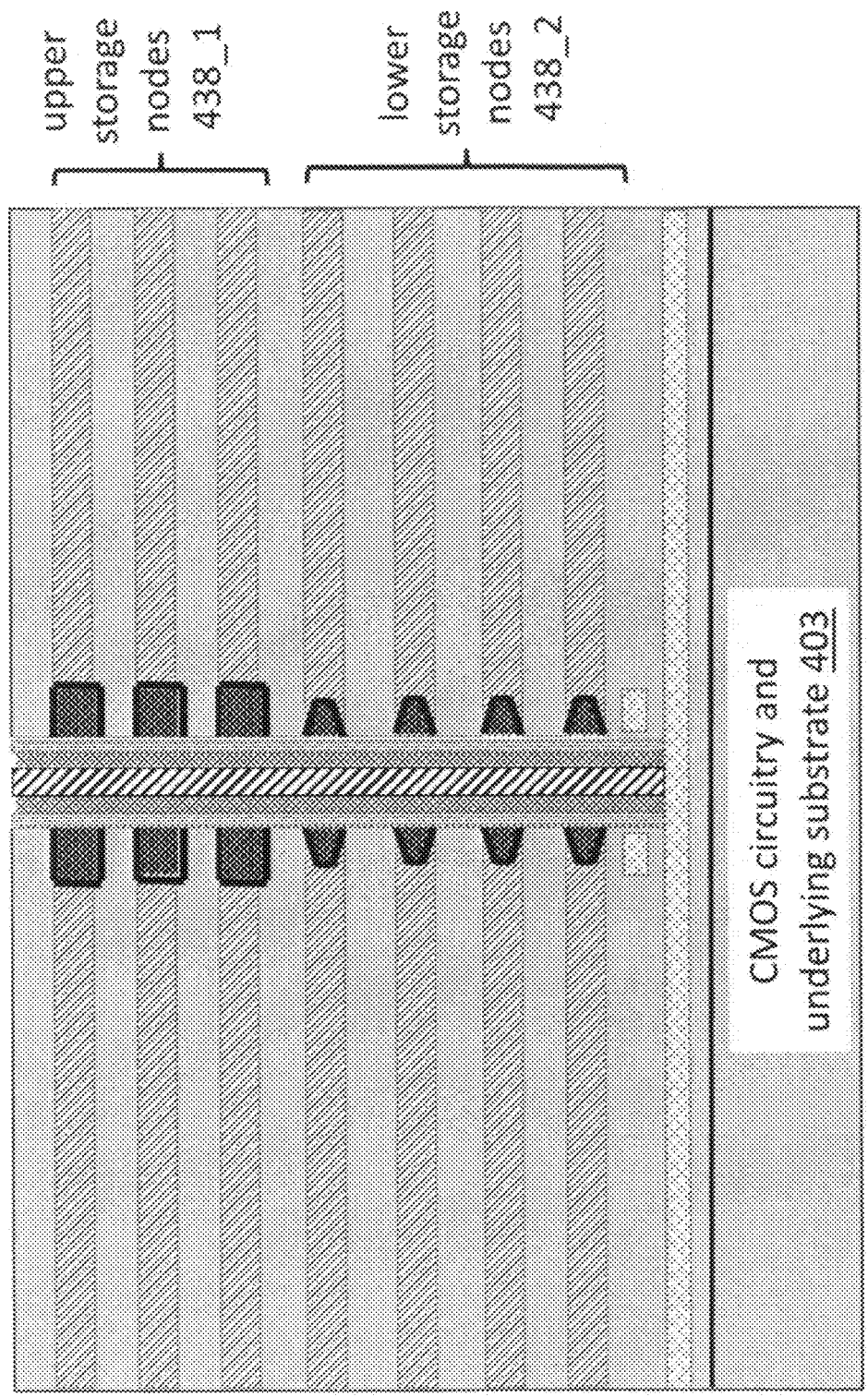

FIG. 4d shows another alternate embodiment in which poly-silicon layer thickness varies—but not continuously through each stack layer. Here, upper storage nodes 418_1 are composed of a first poly-silicon layer thickness and lower storage nodes 418_2 are composed of a second poly-silicon layer thickness. Storage node depth remains constant through all of the stacks however. FIG. 4e shows yet another embodiment in which poly-silicon layer thickness continuously varies but only beyond a specific depth within the stack. Here, upper storage nodes 428_1 have a same poly-silicon layer thickness but lower storage nodes 418_2 have continuously varying poly-silicon layer thickness. FIG. 4f shows yet another embodiment in which different layers have differently shaped storage nodes. Here, upper storage nodes 438_1 have a rectangular shape while lower storage nodes 438_2 have a tapered or triangular shape.

FIG. 5 shows a method described above. As observed in FIG. 5 the method includes simultaneously depositing storage node material at a lower and a higher level of a vertical storage cell stack respectively, wherein, a first amount of the storage node material at the lower level needed to completely form a lower storage node is less than a second amount of the storage node material at the higher level needed to completely form a higher storage node 501.

FIG. 6 shows a depiction of an exemplary computing system 600 such as a personal computing system (e.g., desktop or laptop) or a mobile or handheld computing system such as a tablet device or smartphone, or, a larger computing system such as a server computing system. The computing system may include a three dimensional memory having storage nodes of varying design moving down the storage cell stack as described at length above.

As observed in FIG. 6, the basic computing system may include a central processing unit 601 (which may include, e.g., a plurality of general purpose processing cores and a main memory controller disposed on an applications processor or multi-core processor), system memory 602, a display 603 (e.g., touchscreen, flat-panel), a local wired point-to-point link (e.g., USB) interface 604, various network I/O functions 605 (such as an Ethernet interface and/or cellular modem subsystem), a wireless local area network (e.g., WiFi) interface 606, a wireless point-to-point link (e.g., Bluetooth) interface 607 and a Global Positioning System interface 608, various sensors 609_1 through 609_N (e.g., one or more of a gyroscope, an accelerometer, a magnetometer, a temperature sensor, a pressure sensor, a humidity sensor, etc.), a camera 610, a battery 611, a power management control unit 612, a speaker and microphone 613 and an audio coder/decoder 614.

An applications processor or multi-core processor 650 may include one or more general purpose processing cores 615 within its CPU 601, one or more graphical processing units 616, a memory management function 617 (e.g., a memory controller) and an I/O control function 618. The general purpose processing cores 615 typically execute the operating system and application software of the computing system. The graphics processing units 616 typically execute graphics intensive functions to, e.g., generate graphics information that is presented on the display 603. The memory control function 617 interfaces with the system memory 602. The system memory 602 may be a multi-level system memory.

Each of the touchscreen display 603, the communication interfaces 604-607, the GPS interface 608, the sensors 609, the camera 610, and the speaker/microphone codec 613, 614 all can be viewed as various forms of I/O (input and/or output) relative to the overall computing system including, where appropriate, an integrated peripheral device as well (e.g., the camera 610). Depending on implementation, various ones of these I/O components may be integrated on the applications processor/multi-core processor 650 or may be located off the die or outside the package of the applications processor/multi-core processor 650.

Non volatile storage 620 may hold the BIOS and/or firmware of the computing system. Non volatile storage may be implemented as a FLASH memory including a vertical FLASH memory having varying storage node designs moving down a storage cell stack as described at length above.

Embodiments of the invention may include various processes as set forth above. The processes may be embodied in machine-executable instructions. The instructions can be used to cause a general-purpose or special-purpose processor to perform certain processes. Alternatively, these processes may be performed by specific hardware components that contain hardwired logic for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

The invention claimed is:

1. An apparatus, comprising:
a memory comprising a vertical stack of storage cells, wherein a first storage node at a lower layer of the vertical stack has a smaller vertical thickness than a second storage node at a higher layer of the vertical stack, the storage cells exhibiting gradually smaller respective vertical thickness moving down the vertical stack from an upper region of the vertical stack to a lower region of the vertical stack, a first dielectric layer above or below the lower layer of the vertical stack having a larger vertical thickness than a second dielectric layer above or below the higher layer, wherein the first dielectric layer is below the second dielectric layer, the vertical stack exhibiting gradually larger dielectric layer thickness between the storage cells moving down the vertical stack from the upper region of the vertical stack to the lower region of the vertical stack.

2. The apparatus of claim 1 wherein the first storage node has a shallower lateral depth than the second storage node.

3. The apparatus of claim 1 wherein the first storage node has a different shape than the second storage node.

4. The apparatus of claim 1 wherein the first storage node has a tapered shape.

5. The apparatus of claim 1 wherein the storage cell stack comprises increasingly thinner poly silicon layers in a direction down the vertical stack.

6. The apparatus of claim 1 wherein the storage cell stack comprises increasingly smaller storage cell nodes in a direction down the vertical stack.

7. A computing system, comprising:
a plurality of processing cores;
a memory controller coupled to the plurality of processing cores;

a system memory coupled to the memory controller;
a display;
a non volatile memory, said non volatile memory comprising a vertical stack of storage cells, wherein a first storage node at a lower layer of the vertical stack has a smaller vertical width than a second storage node at a higher layer of the vertical stack, the storage cells exhibiting gradually smaller respective vertical width moving down the vertical stack from an upper region of the vertical stack to a lower region of the vertical stack, a first dielectric layer above or below the lower layer of the vertical stack having a larger vertical thickness than a second dielectric layer above or below the higher layer, wherein the first dielectric layer is below the second dielectric layer, the vertical stack exhibiting gradually larger dielectric layer thickness between the storage cells moving down the vertical stack from the upper region of the vertical stack to the lower region of the vertical stack.

8. The apparatus of claim 7 wherein the first storage node has a shallower lateral depth than the second storage node.

9. The apparatus of claim 7 wherein the first storage node has a different shape than the second storage node.

10. The apparatus of claim 7 wherein the first storage node has a tapered shape.

11. The apparatus of claim 7 wherein the storage cell stack comprises increasingly thinner poly silicon layers in a direction down the vertical stack.

12. The apparatus of claim 7 wherein the storage cell stack comprises increasingly smaller storage cell nodes in a direction down the vertical stack.

13. The apparatus of claim 7, further comprising one or more of:
a network interface communicatively coupled to at least one of the plurality of processing cores;
a battery coupled to at least one of the plurality of processing cores.

14. An apparatus, comprising:
a memory comprising a vertical stack of storage cells, wherein a first storage node at a lower layer of the vertical stack has a smaller outer radius than a second storage node at a higher layer of the vertical stack, the storage cells exhibiting gradually smaller respective outer radius moving down the vertical stack from an upper region of the vertical stack to a lower region of the vertical stack, a first dielectric layer above or below the lower layer of the vertical stack having a larger vertical thickness than a second dielectric layer above or below the higher layer, wherein the first dielectric layer is below the second dielectric layer, the vertical stack exhibiting gradually larger dielectric layer thickness between the storage cells moving down the vertical stack from the upper region of the vertical stack to the lower region of the vertical stack.

15. The apparatus of claim 14 wherein the first storage node has a smaller vertical width than the second storage node.

16. The apparatus of claim 14 wherein the first storage node has a different shape than the second storage node.

17. The apparatus of claim 16 wherein the first storage node has a tapered shape.

18. The apparatus of claim 14 wherein the storage cell stack comprises increasingly thinner poly silicon layers in a direction down the vertical stack.

19. The apparatus of claim 14 wherein the storage cell stack comprises increasingly smaller storage cell nodes in a direction down the vertical stack.

* * * * *